(12) United States Patent
    Suiter

(10) Patent No.: US 8,839,174 B2
(45) Date of Patent: Sep. 16, 2014

(54) PLACEMENT AND AREA ADJUSTMENT FOR HIERARCHICAL GROUPS IN PRINTED CIRCUIT BOARD DESIGN

(71) Applicant: Mentor Graphics Corporation, Wilsonville, OR (US)

(72) Inventor: Gerald P. Suiter, Madison, AL (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/755,587

(22) Filed: Jan. 31, 2013

(65) Prior Publication Data
    US 2013/0198708 A1    Aug. 1, 2013

Related U.S. Application Data

(60) Provisional application No. 61/956,169, filed on Jan. 31, 2012.

(51) Int. Cl.
    *G06F 17/50*    (2006.01)
(52) U.S. Cl.
    USPC .......................................... 716/118; 716/137
(58) Field of Classification Search
    USPC ................................................ 716/118, 137
    See application file for complete search history.

(56) References Cited

U.S. PATENT DOCUMENTS

| | | | | |
|---|---|---|---|---|
| 5,309,371 A | * | 5/1994 | Shikata et al. | 716/121 |
| 5,406,498 A | * | 4/1995 | Yabe | 716/119 |
| 5,847,968 A | * | 12/1998 | Miura et al. | 716/123 |
| 6,684,380 B2 | * | 1/2004 | Rubin et al. | 716/137 |
| 7,120,885 B2 | * | 10/2006 | Nakayama et al. | 716/115 |
| 2007/0220470 A1 | * | 9/2007 | Meyyappan et al. | 716/10 |

* cited by examiner

*Primary Examiner* — Jack Chiang
*Assistant Examiner* — Brandon Bowers
(74) *Attorney, Agent, or Firm* — Banner & Witcoff, Ltd.

(57) ABSTRACT

Aspects of the invention are directed towards placing components within a layout design for a PCB. More specifically, various implementations of the invention provide methods and apparatuses that can dynamically adjust the shape or placement of component groups during an HGP process. With some implementations of the invention, an HGP process for planning the layout of a PCB is provided. Furthermore, component groups, which conflict, geographically, with either another component group or some other object within the layout design are allowed to be placed during the planning process. Subsequently, the placement locations for one or both of the conflicting component groups are adjusted to resolve the conflict. In some implementations, the geometric boundary, or footprint, of one or both of the component groups is adjusted to resolve the conflict.

20 Claims, 14 Drawing Sheets

PLACEMENT AND AREA ADJUSTMENT FOR HIERARCHICAL GROUPS IN PRINTED CIRCUIT BOARD DESIGN

CROSS REFERENCE TO RELATED APPLICATIONS

This application claims priority to a provisional application having the same title, filed Jan. 31, 2012, having first named inventor Gerald Suiter, which was itself originally filed as non-provisional application 13/362,664, on Jan. 31, 2012, and subsequently converted to a provisional application via petition (not yet acted upon) dated Sep. 15, 2012. Priority is also claimed from non-provisional application 13/362,664, filed Jan. 31, 2012, having the same title, to any extent necessary to perfect priority for this application to Jan. 31, 2012. Each of the referenced applications is herein incorporated by reference in its entirety for all purposes.

FIELD OF THE INVENTION

The present invention is directed towards printed circuit board design. More specifically, various implementations provide a circuit board development environment capable of dynamically planning the circuit board layout using a hierarchical group planning process.

BACKGROUND OF THE INVENTION

Integrated circuit devices are used in a wide variety of modern appliances, such as computers, automobiles, telephones, televisions, manufacturing tools, satellites and even toys. While even a small integrated circuit device can provide a great deal of functionality, almost every integrated circuit device must be electrically connected to an input or output device, to another integrated circuit device, or to some other electronic component in order to be useful. To provide these electrical connections, integrated circuit devices are typically mounted on a printed circuit board (PCB). Most PCB's have a rigid, planar core. The core may be formed, for example, of a sheet of fiberglass material impregnated with epoxy. Conductive lines or "traces" then are formed on one or both surfaces of the core, to electronically connect the components attached to the PCB.

There are a number of steps performed in the design of a PCB, often referred to as the "design flow." An illustrative design flow may include an initial step where a designer creates a schematic diagram for the system to be connected through the PCB. This process includes identifying each component that will be included in the system. A system can include "active" components, such as, for example, field programmable gate arrays (FPGA's,) integrated circuits, and application-specific integrated circuits (ASIC's). A system also can include "passive" components, such as, for example, resistors, capacitors, and inductors. In addition to identifying each component, the schematic design will represent the electrical connections that must be formed between each component.

Once the schematic design is finalized, the designer will typically create a physical design to implement the schematic design. This physical design is sometimes referred to as the layout design. The designer will begin by selecting a physical location in the layout design for each component. After a location in the layout design for the various components has been selected, the designer then will route traces in the layout design to connect the components as specified in the schematic design.

As those of ordinary skill in the art will appreciate, due to the large number of components in modern electronic designs, placing components in the layout design can be a tedious and time consuming process. In order to increase placement efficiency, components are often grouped together and represented by geometric shapes. These geometric shapes are often referred to as "component groups." The component groups, representing the individual component located therein, are placed into locations within the layout design. As such, a single item (e.g. a component group) can be placed which represents multiple items (e.g. individual components.) This process of using component groups to represent a collection of components for placement is commonly referred to as hierarchical group planning (HGP). Although using an HGP methodology to place components within a layout is more efficient than manually placing each component, there are still inefficiencies in the placement process. For example, although some automated placement of component groups is possible, conventional HGP methodologies still require the user to manually place many of the component groups and to adjust the geometric shape of component groups in order to resolve conflicts between group boundaries and allow for the placement of all necessary component groups within the layout.

BRIEF SUMMARY OF THE INVENTION

Aspects of the invention are directed towards placing components within a layout design for a PCB. More specifically, various implementations of the invention provide methods and apparatuses that can dynamically adjust the shape or placement of component groups during an HGP process.

With some implementations of the invention, an HGP process for planning the layout of a PCB is provided. Furthermore, component groups, which conflict, geographically, with either another component group or some other object within the layout design are allowed to be placed during the planning process. Subsequently, the placement locations for one or both of the conflicting component groups are adjusted to resolve the conflict. In some implementations, the geometric boundary, or footprint, of one or both of the component groups is adjusted to resolve the conflict.

In various implementations, the footprint of a component group may be dynamically adjustable during the placement process. In various implementations, the footprint may be adjusted subject to the constraint that the area of the component group remains constant. In some implementations, the footprint may be adjustable subject to the constraint that the aspect ratio of the component group remains fixed. With some implementations, the footprint may be adjustable subject to minimum width and length constraints.

With various implementations, the adjustment of the footprint of a component group, the placement location of a component group, or both, may be made according to a number of heuristics. For example, in some implementations, when a group is placed that conflicts with another already placed group, the footprint of the already placed group may be adjusted to allow the placement without conflicts. If the footprint cannot be adjusted any further due to some constraints, yet the conflict is still not resolved, then the footprint of the newly placed group may be adjusted in order to fully resolve the conflict.

These and additional implementations of invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are often high-level abstractions of the actual operations that are performed. The actual operations that correspond to these terms will often vary depending on the particular implementation.

Some of the methods described herein can be implemented by software stored on a computer readable storage medium, or executed on a computer. Accordingly, some of the disclosed methods may be implemented as part of a computer implemented electronic design automation ("EDA") tool. The selected methods could be executed on a single computer or a computer networked with another computer or computers.

Illustrative Operating Environment

Figure 1:
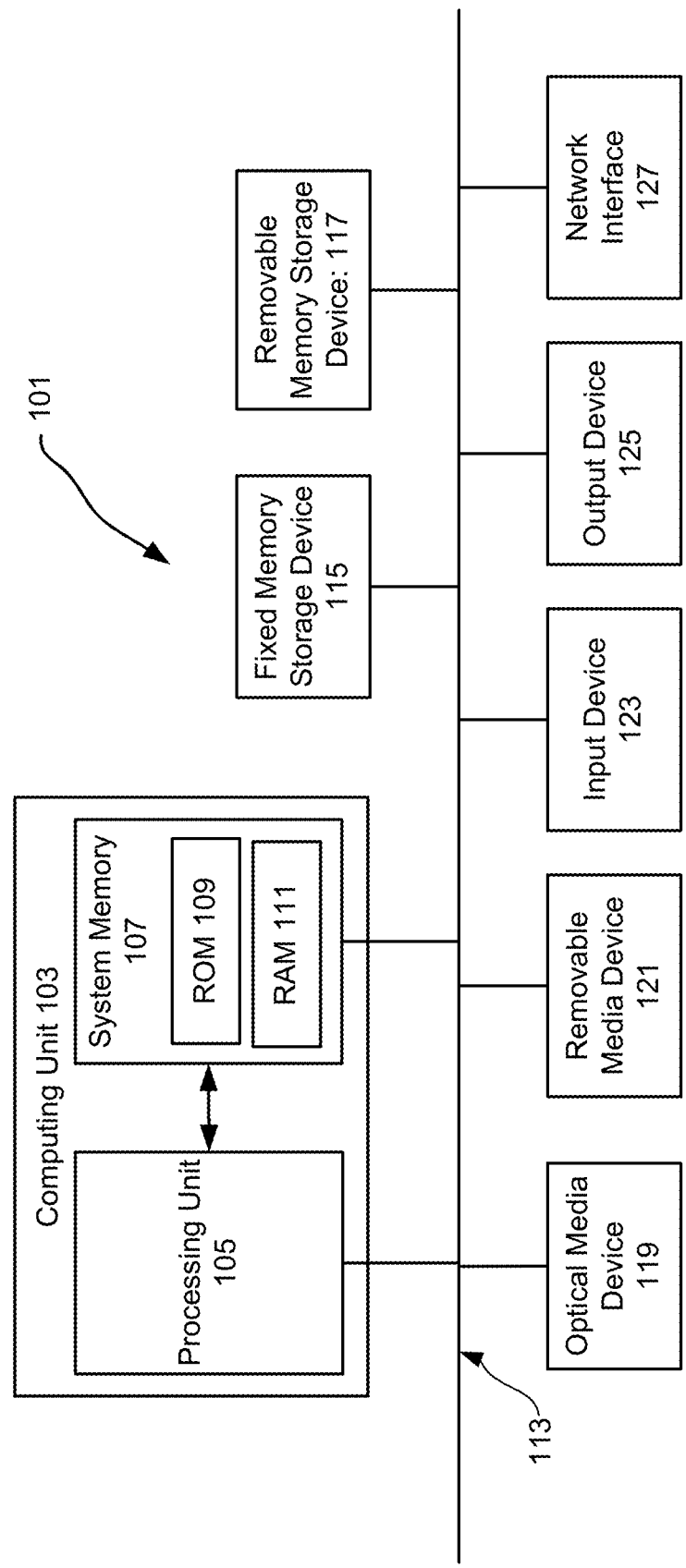
FIG. 1 illustrates an illustrative computing device.

As the techniques of the present invention may be implemented using software instructions, the components and operation of a computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory ("ROM") 109 and a random access memory ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

As stated above, various embodiments of the invention may be implemented using software instructions. These software instructions may be stored on one or more computer readable media or devices, such as, for example, the system memory 107, or an optical disk for use in the optical media device 119. As those of ordinary skill in the art will appreciate, software instructions stored in the manner described herein are inherently non-transitory in nature. More specifically, the software instructions are available for execution by the computer system 101, as opposed to being transmitted to the computer system via a carrier wave or some other transitory signal.

Hierarchical Group Planning

Figure 2A:
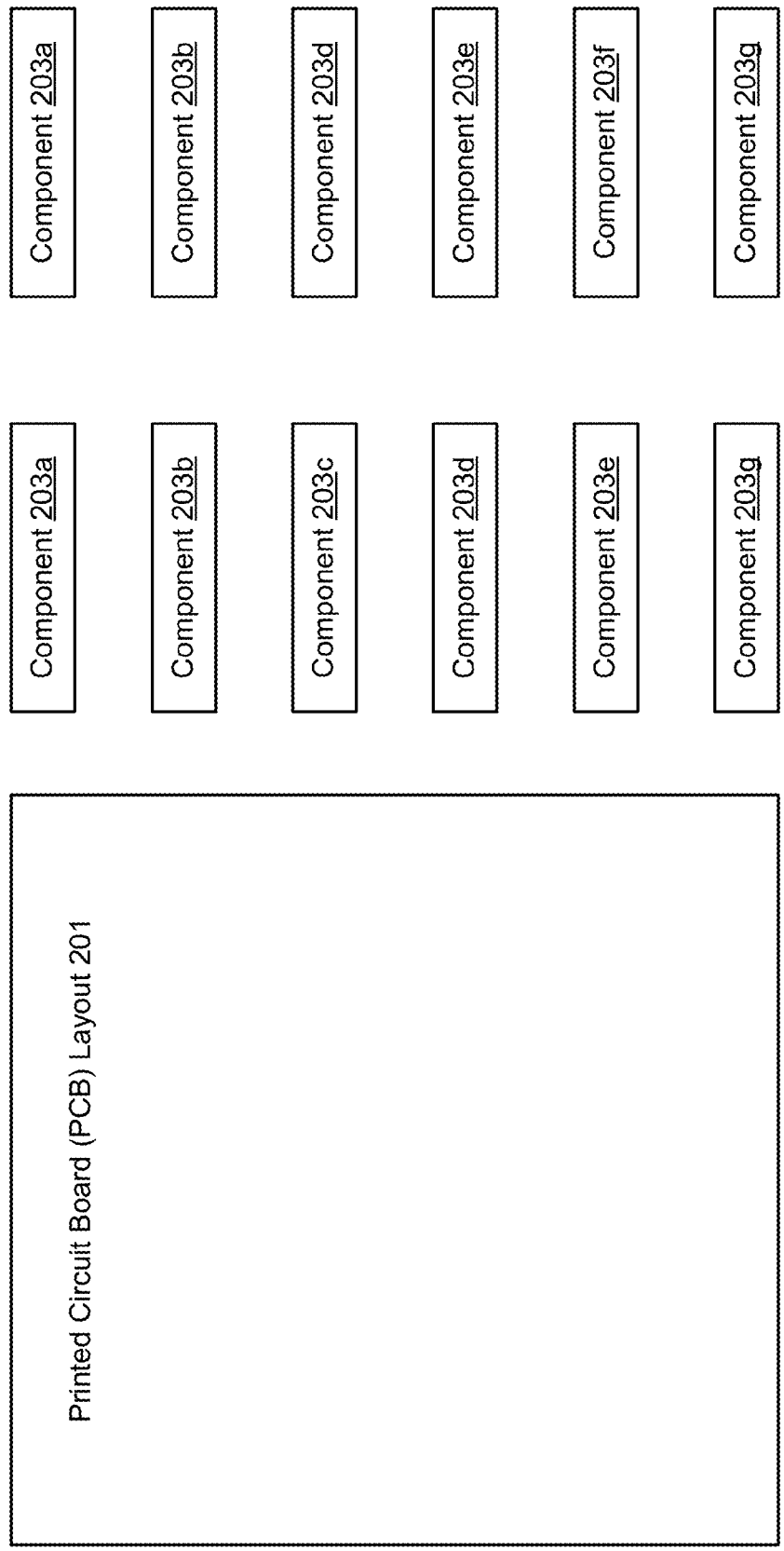
FIG. 2A illustrates a layout for a printed circuit board and component needing to be placed within the layout.

As stated above, various implementations of the invention are applicable to resolving conflicts that arise when placing components within a layout design using a hierarchical group planning (HGP) methodology. As such, a brief discussion of HGP techniques is given here. FIG. 2A illustrates a layout design for a printed circuit board (PCB layout) 201 and components 203 needing to be placed at locations within the PCB layout 201. As detailed above, the layout for a PCB (e.g. the PCB layout 201) is generated by placing components specified in a schematic design for the PCB into locations within the layout and routing traces between the components according to the connectivity specified in the schematic. As can be seen from this figure, the PCB layout 201 is empty. More specifically, the placement and routing processes have not been carried out yet. That is, physical locations within the PCB layout 201 for the components 203 and the wiring needed to connect the components 203 has not yet been identified.

Figure 2B:
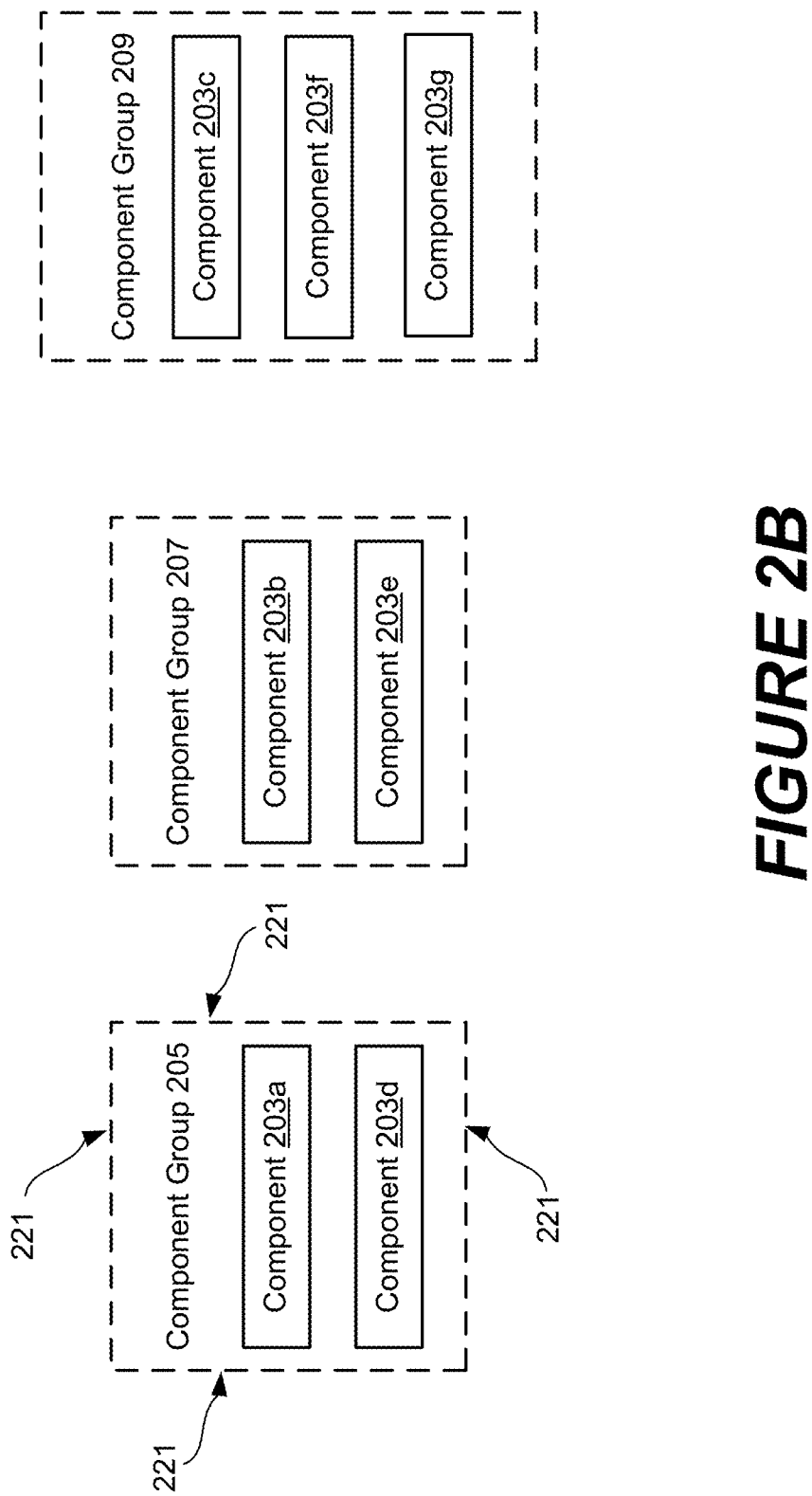
FIG. 2B illustrates component groups formed around ones of the components shown in FIG. 2A.

In order to facilitate placing the component 203 within the layout design 201; geometric groups are formed that include selections of the components 203. FIG. 2B illustrates component groups 205 through 209. As can be seen from this figure, some of the components 203 have been grouped into the component groups 205-209, which are represented by a geometric shape. For example, as can be seen in this figure, the component groups 205-209 are shown as rectangles. In various implementations of the invention, other geometric shapes, such as, for example, squares, circles, triangles, trapezoids, or complex geometric shapes may be used to define the boundary of the component planning groups. Furthermore, combinations of different geometric shapes may be used, for example, some component groups may be defined by squares while others are defined by rectangles.

Component groups (e.g. the component groups 205-209) are further defined by their geometric boundary. For example, the borders 221 for the component group 205, which defines the area occupied by this component group, are shown in FIG. 2B. The geographic area occupied by a particular component group within a layout, is referred to herein as the "footprint" for the component group. It is important to note that the footprint, as used herein, can be different for two component groups which have the same geometric area. For example, the geometric area for a square having a length and width of 1 unit each is 1 unit squared. Similarly, a rectangle having a length of 2 units and a width of 0.5 units is also 1 unit squared. However, as those of ordinary skill in the art will appreciate, the footprints of these two shapes, that is, the geographic area occupied in a layout, will be different.

Figure 2C:
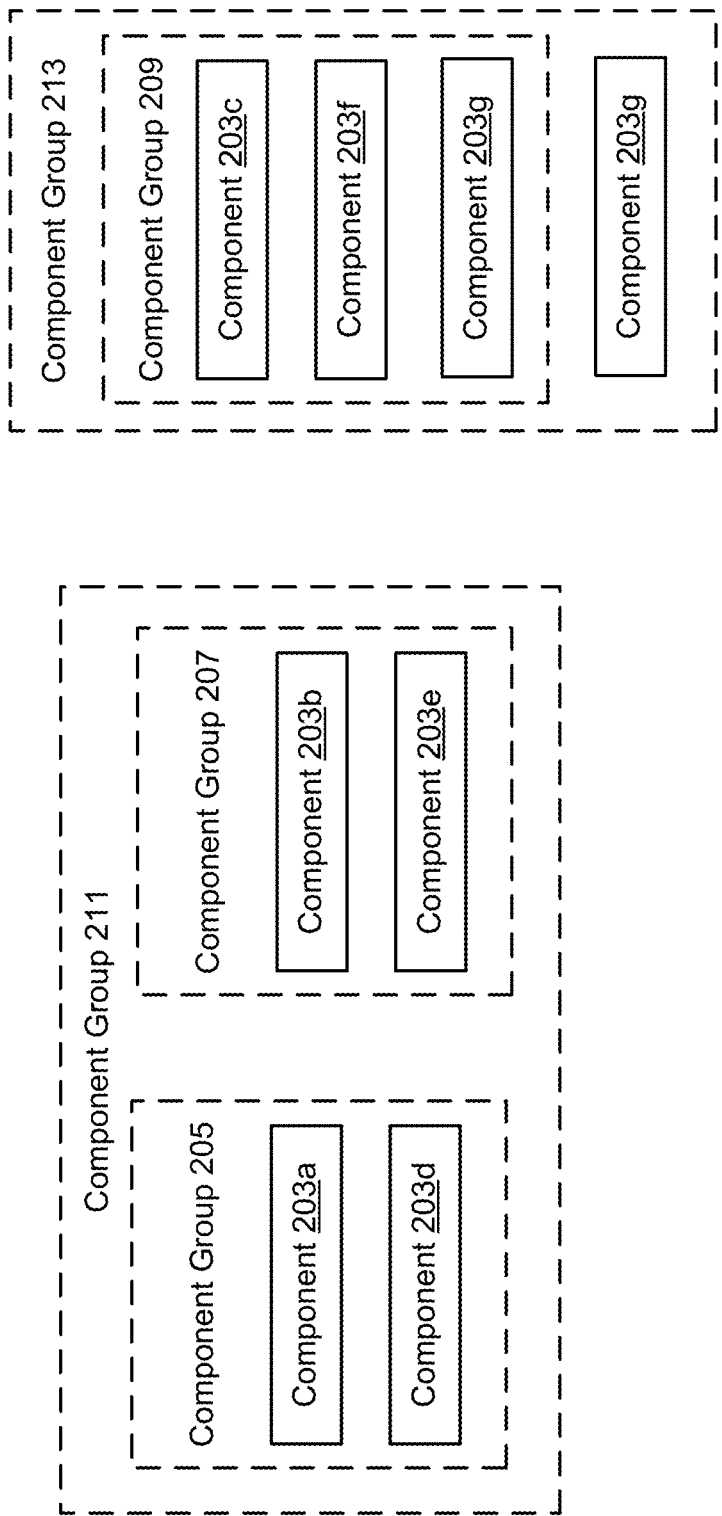
FIG. 2C shows hierarchical component groups.

With various implementations of the invention, a component group may include other component groups. More specifically, a hierarchical structure of component groups may be created where component groups may include other component groups or a combination of other component groups and actual components. For example, FIG. 2C illustrates component groups 211 and 213, which as can be seen from this figure, include the component planning groups 205-209 and other components 203. Additionally, a single component group, such as, for example, the component group 211, may be placed at multiple locations in a layout (i.e. reused) in order for the correct number of components 203 to be placed in the layout design 201.

Figure 2D:
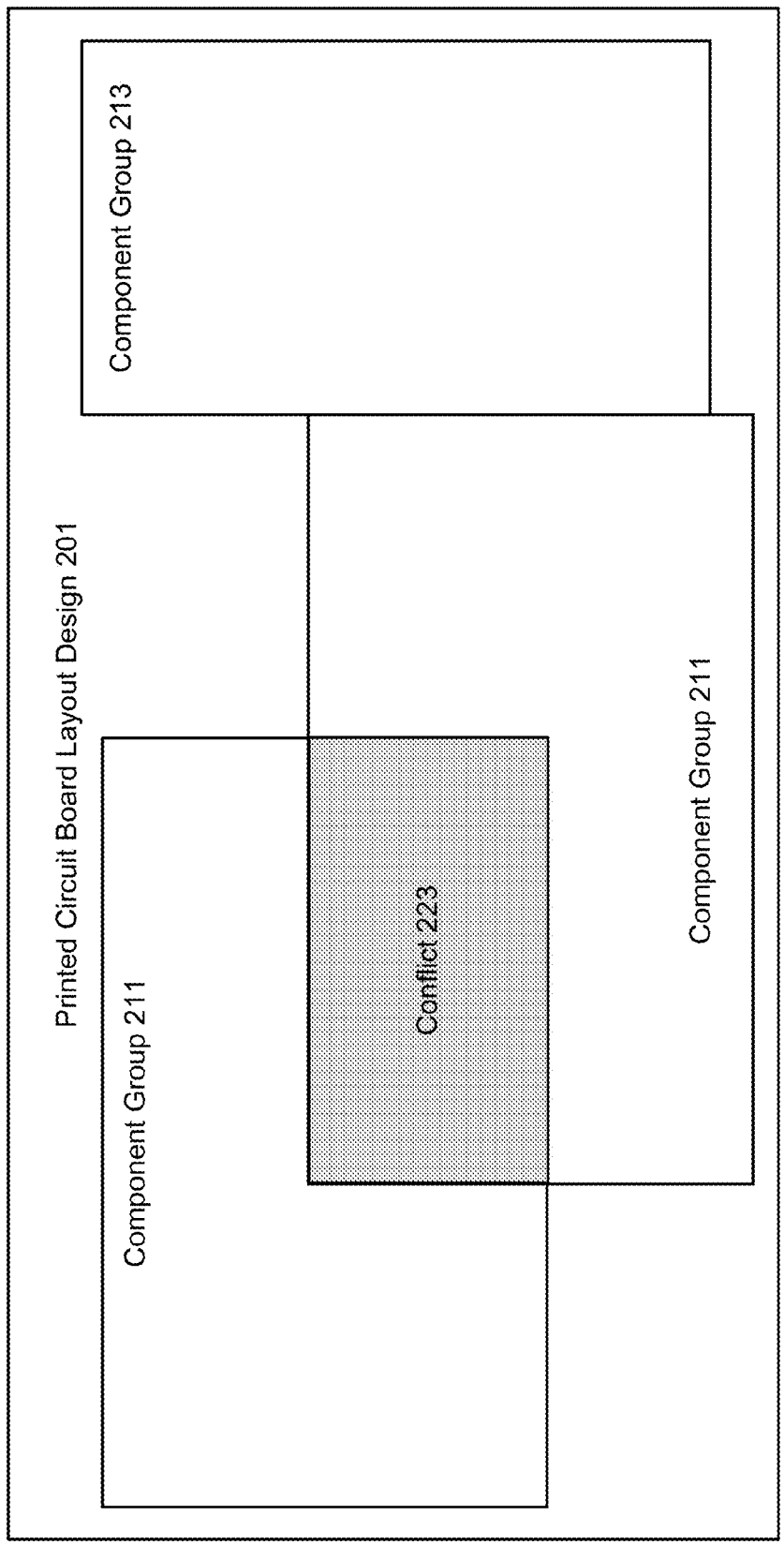
FIG. 2D shows the layout of FIG. 2A with component groups placed therein.

Once the component groups are defined, they then are placed at locations within the layout design 201. FIG. 2D shows the layout design 201 having component groups 211 and 213 placed at location therein. However, as can be seen from this figure, there is a conflict 223 between the footprints of the component groups 211. More specifically, the area occupied within the layout design 201 by the component groups 211 overlaps, as shown by the conflicted area 223. As a result, some adjustments to the layout design 201 need to be made. More specifically, the placement location, the footprint, or some combination of thereof, needs to be adjusted for some or all of the component groups 211 and 213.

As those of ordinary skill in the art will appreciate, modern layout designs are many times more complicated than represented in FIGS. 2A-2D. As a result, electronic design automation (EDA) tools, such as, for example, software programs executing on a computer system, are used to assist in the design and placement of PCB's. Furthermore, various EDA tools that assist in forming and placing component groups without the user explicitly specifying each component group and placement location exist. However, conventional tools lack the ability to resolve placement conflicts, such as, for example, the conflict 223 depicted in FIG. 2D.

Component Group Adjustment for Hierarchical Group Planning

Figure 3:
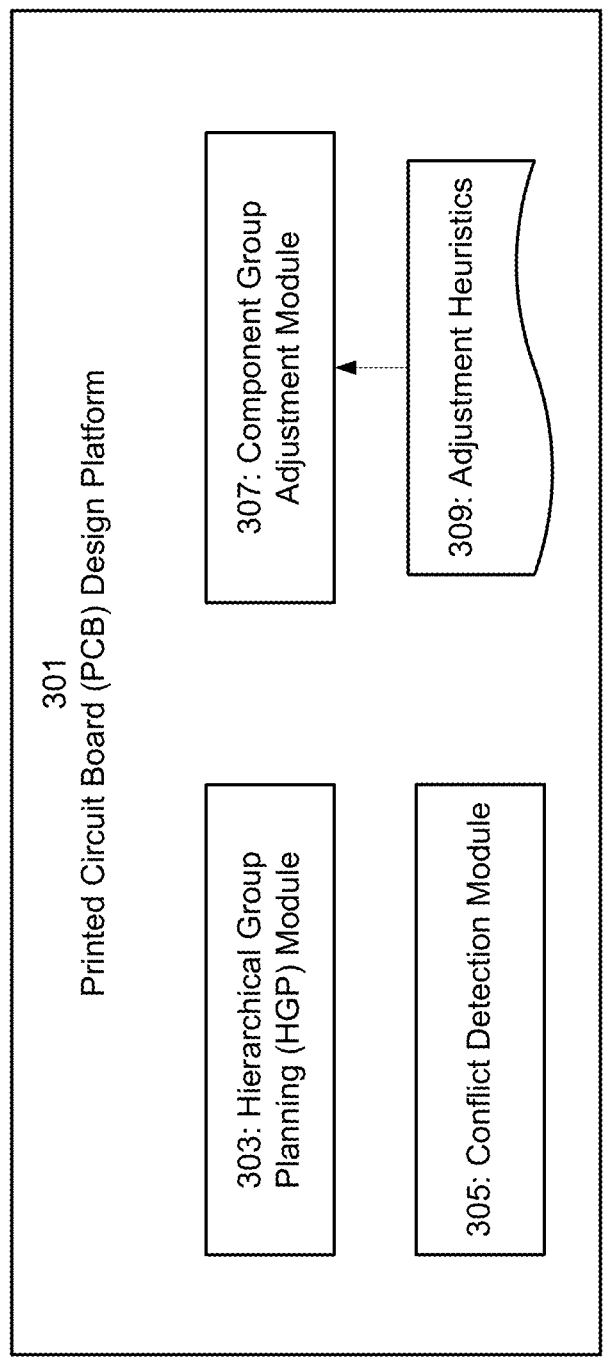
FIG. 3 shows a printed circuit board design platform that may be provided according to various implementations of the present invention.

FIG. 3 illustrates a PCB design platform 301 that may be provided by various implementations of the invention. As can be seen from this figure, the PCB design platform 301 includes an HGP module 303. The HPG module 303 is configured to provide a computer-implemented HGP environment, such as, for example, the Expedition PCB software available from Mentor Graphics Corporation of Wilsonville, Oreg. With various implementations, the HGP module 303 is configured to provide a graphical design environment, capable of forming component groups, placing component groups in a layout design and routing traces between components within the component groups.

The PCB design platform 301 further includes a conflict detection module 305 configured to detect conflicts, such as, for example, the conflict 223 illustrated in FIG. 2D, during placement of component groups by HGP planning module 303. In various implementations of the invention, the conflict detection module 305 detects conflicts between component groups placed by the HGP module 303. With some implementations, conflicts between a component group placed by the HGP planning module 303 and other PCB layout items, such as, for example, busses, power connectors, or other fixed objects within the PCB layout may be detected by the conflict detection module 305.

With various implementations, placement conflicts can be of the type detailed above, that is, where the boundaries of a component group overlap with the boundary of another object within the layout. In other implementations, a conflict can also include a specified minimum distance between objects as well. For example, although the boundaries of two component groups may not overlap, if the boundaries are within the minimum distance from each other, a conflict will be identified by the conflict detection module 305.

The PCB design platform 301 also includes a component group adjustment module 307 configured to adjust the placement and/or footprint of component groups in order to resolve the conflicts detected by the conflict detection module 305. With various implementations, the component group adjustment module 307 adjusts the component groups based on a set of adjustment heuristics 309.

Figure 4:
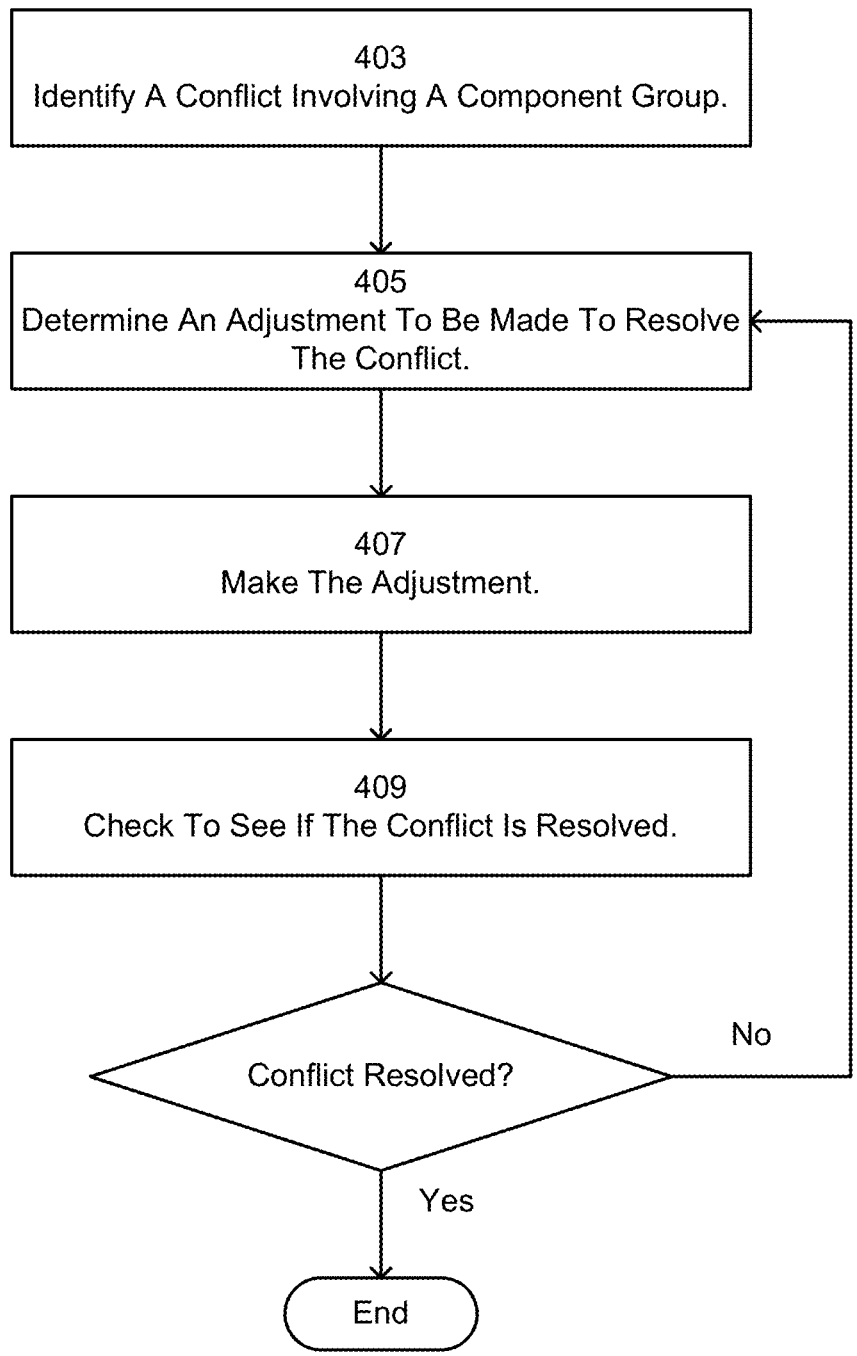
FIG. 4 shows a method of adjusting component groups within a hierarchical group planning process.

FIG. 4 illustrates a method 401 that may be provided by various implementations of the invention to adjust the footprint or placement of component groups in order to resolve placement conflicts. The method 401 includes an operation 403 for identifying a conflict within a PCB layout that involves a component group, an operation 405 for determining an adjustment to be made to the PCB layout, an operation 407 for making the adjustment, and an operation 409 for checking to see if the conflict has been resolved. As can be seen, if the conflict has not been resolved, then the method 401 returns to the operation 405 and determines another adjustment to be made to the component group.

With various implementations, the operation 405 may determine that the footprint for the component group causing the conflict, which was placed last, needs to be adjusted. In some implementations, the operation 405 may determine that the placement location for the component group causing the conflict, which was placed first, needs to be adjusted. With some implementations, the operation 405 may determine that the footprint for the component group causing the conflict, which has the larger area, needs to be adjusted.

In various implementations, as indicated above, conflicts can arise between component groups, such as, for example, the conflict 223 discussed above. With some implementations, conflicts can arise between a component group and other objects within the layout design, such as, for example, a power bus routed in the PCB layout. As those of ordinary skill in the art will appreciate, there are a number of different objects within the layout for a PCB which may cause conflicts with the placement of component groups. As such, no intention is made here to exhaustively list all potential objects with which a conflict can arise. Nor is it intended to exhaustively list all potential combinations of adjusting the component groups to resolve the conflicts. However, various illustrative adjustments and heuristics for determining which adjustments to make are presented here for clarity.

Illustrative Component Group Adjustments and Heuristics

Figure 5A:
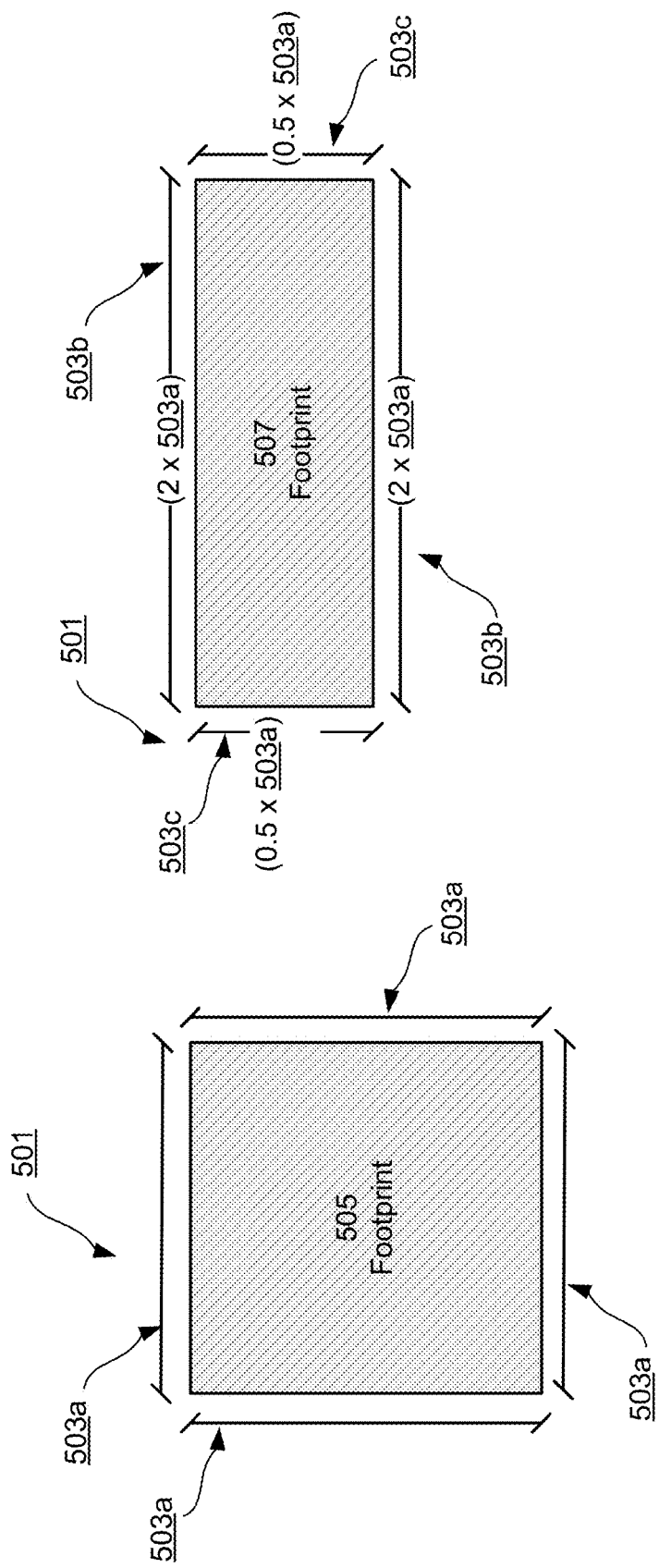
FIG. 5A shows a component group.

As detailed above, with various implementations, the footprint for a component group may be adjusted while the area for the component group remains fixed. FIG. 5A shows a component group 501, with borders 503, which may be adjusted during an HGP process. As can be seen from this figure, the component group 501 is shown having a footprint 505 and a footprint 507. As can be further seen, the area for the component group 501 is the same for both footprints 505 and 507, as indicated by the length of the borders 503. More specifically, the footprint 505 corresponds to the component group 501 where each of the borders 503 has a length equal to 503a. The footprint 507 corresponds to where the length of the borders 503 for the component group 501 have been adjusted to be 0.5 the length 503a (e.g. the borders 503c) and 2 times the length 503a (e.g. the borders 503b) respectively. Accordingly, the geometric area for the footprints 507 and 505 are the same, however the geographic area (i.e. footprint) for the component group 501 is different between the two versions shown in FIG. 5A.

Figure 5B:
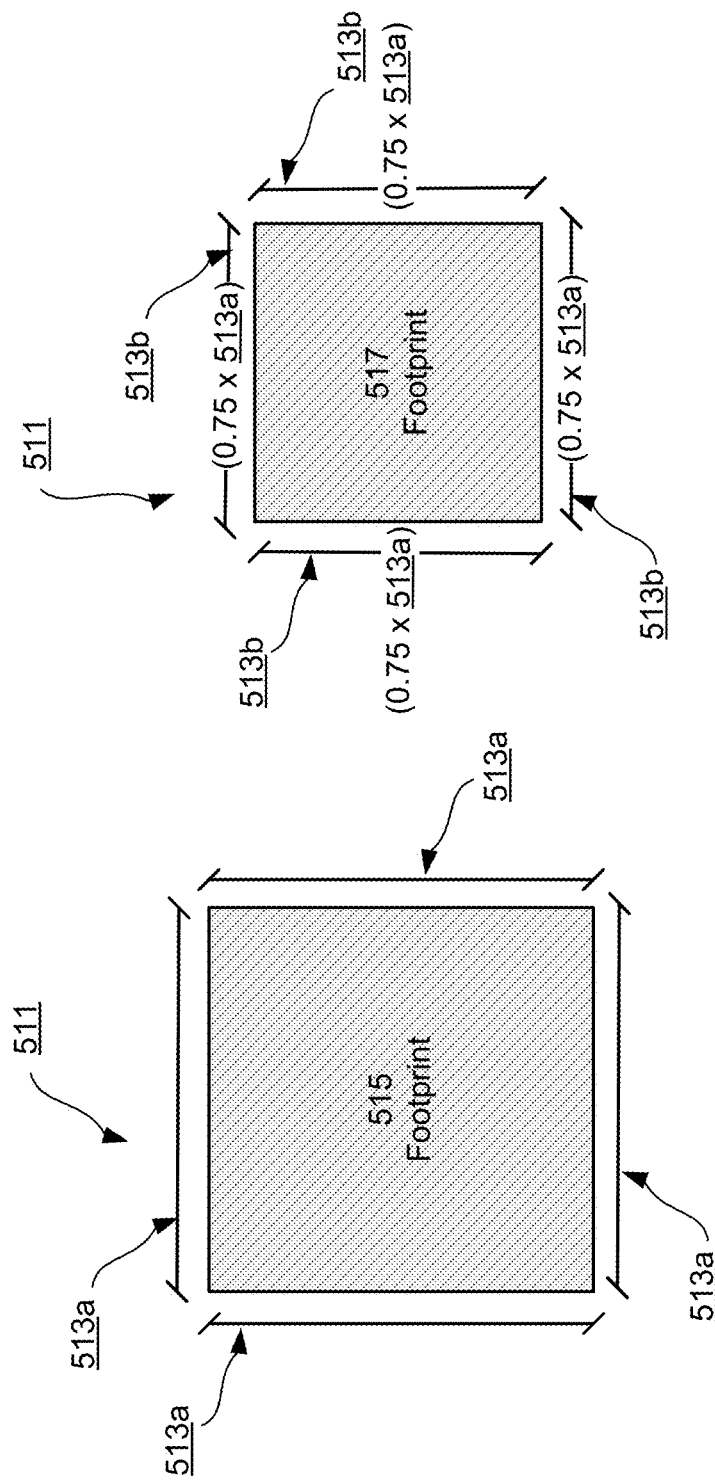
FIG. 5B shows a component group.

With some implementations, the footprint for a component may be adjusted, while the aspect ratio remains fixed. As used herein, the aspect ratio is the ratio of one dimension (e.g. the height) to the other dimension (e.g. the length.) For example, FIG. 5B shows a component group 511, with borders 513. The component group is represented having footprints 515 and 517, which as can be seen, are different, yet the aspect ratio remains the same for both footprints 515 and 517. More specifically, the footprint 515 has an aspect ratio of 1, as indicated one dimension having length 513a and the other dimension also having length 513a. Similarly, the aspect ratio for the footprint 517 is also 1, as one dimension has sides 513 of length of 513b and the other dimension also has sides 513 of length 513b.

As those of ordinary skill in the art will appreciate, other geometric shapes, such as for example, squares and triangles may also be adjusted to have different footprints, yet similar area, or aspect ratios, as detailed herein.

The footprints for a component group may also be adjusted, by reducing the width of the component group, the height of the component group, or a combination of both. With some further implementations, the width, the height, or both may be adjustable to a minimum value. With various further implementations, the width, the height, or both may be adjustable to be between a minimum value and maximum value. With some implementations, the minimum value will be based on the size of the component stored within the component group. For example, the minimum width of a component group could be constrained by the maximum width of the largest component included in the component group. In some implementations, the minimum value will be specified by a user.

In various implementations, a component group may become unavailable for adjustment or "locked." More specifically, the component group's footprint or location within the layout may not be adjusted, by, for example, the component group adjustment module 307 shown in FIG. 3. With some implementations, a user may "lock" a component group's footprint, location, or both. With further implementations, a user may adjust the footprint, location, or both, of a component group, whereupon the component group will then become locked until the user specifies otherwise.

Figure 6A:
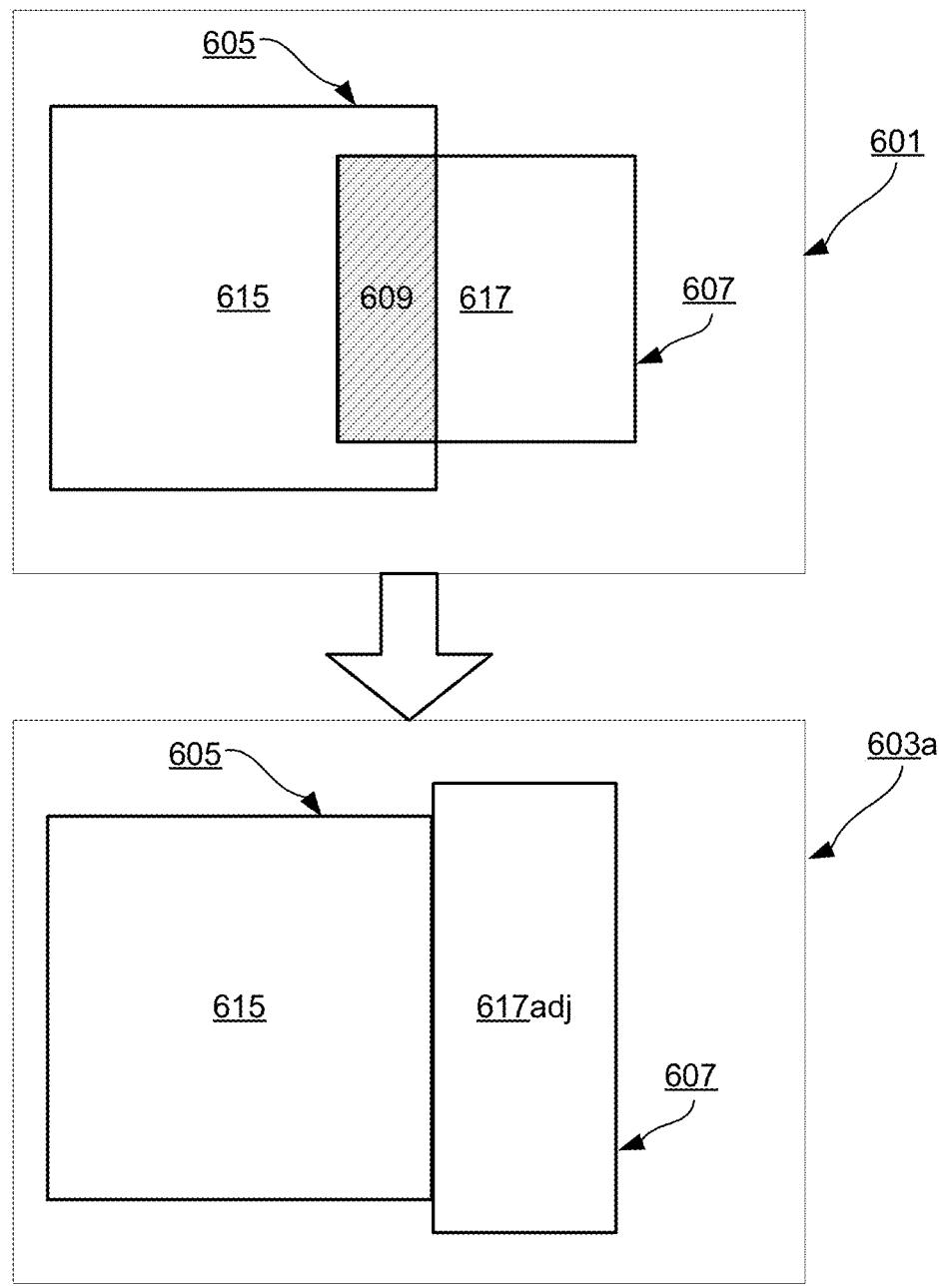
FIG. 6A a PCB design.

As indicated above, component groups are adjusted in order to resolve conflicts between the placement of a component group and the object (e.g. component group, bus, power rail, etc.) in the layout design. FIG. 6A shows a PCB layout 601, including a first component group 605 and a second component group 607 placed therein. As can be seen from this figure, the first component group 605 and the second component 607 conflict over the area 609. More particularly, the footprint 615 (i.e. the footprint for the first component group 605) and the footprint 617 (i.e. the footprint for the second component group 607) conflict, as illustrated by the area 609.

With some implementations, a heuristic will be provided, which specifies that the originally placed component group (e.g. the first component group 605) will "squeeze" the subsequently placed component group (e.g. the second component group 607) in order to resolve the conflict. For example, as illustrated in this figure, a modified layout 603a is shown, which shows the layout 601, where the footprint 617 for the second component group 607 has been adjusted, as shown by the adjusted footprint 617adj. As can be further seen, the conflict has been resolved, that is, the area where the footprints overlapped has been removed.

Figure 6B:
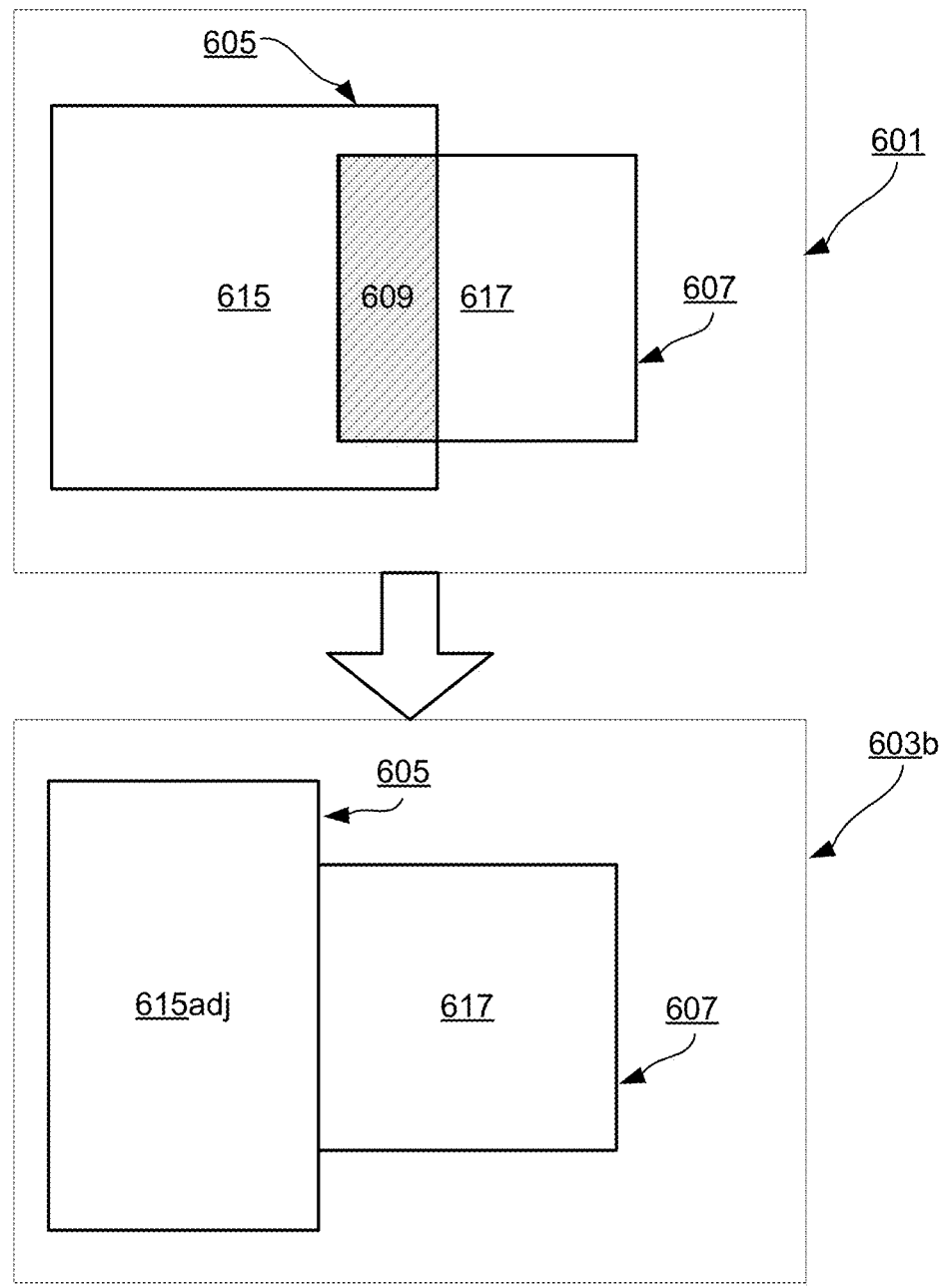
FIG. 6B a PCB design.

In some implementations, a heuristic that states the subsequently placed component group will squeeze the originally placed component group will be provided. For example, FIG. 6B illustrates the layout 601 of FIG. 6A, including the component groups 605 and 607, the footprints 615 and 617 and the conflicted area 609. However, as can be seen, an adjusted layout 603b is shown, where the footprint 615 has been adjusted as represented by the adjusted footprint 615adj. With some implementations, a heuristic specifying that the larger component group will be adjusted first, such as, for example, by "squeezing" the footprint as detailed above is provided.

Figure 6C:
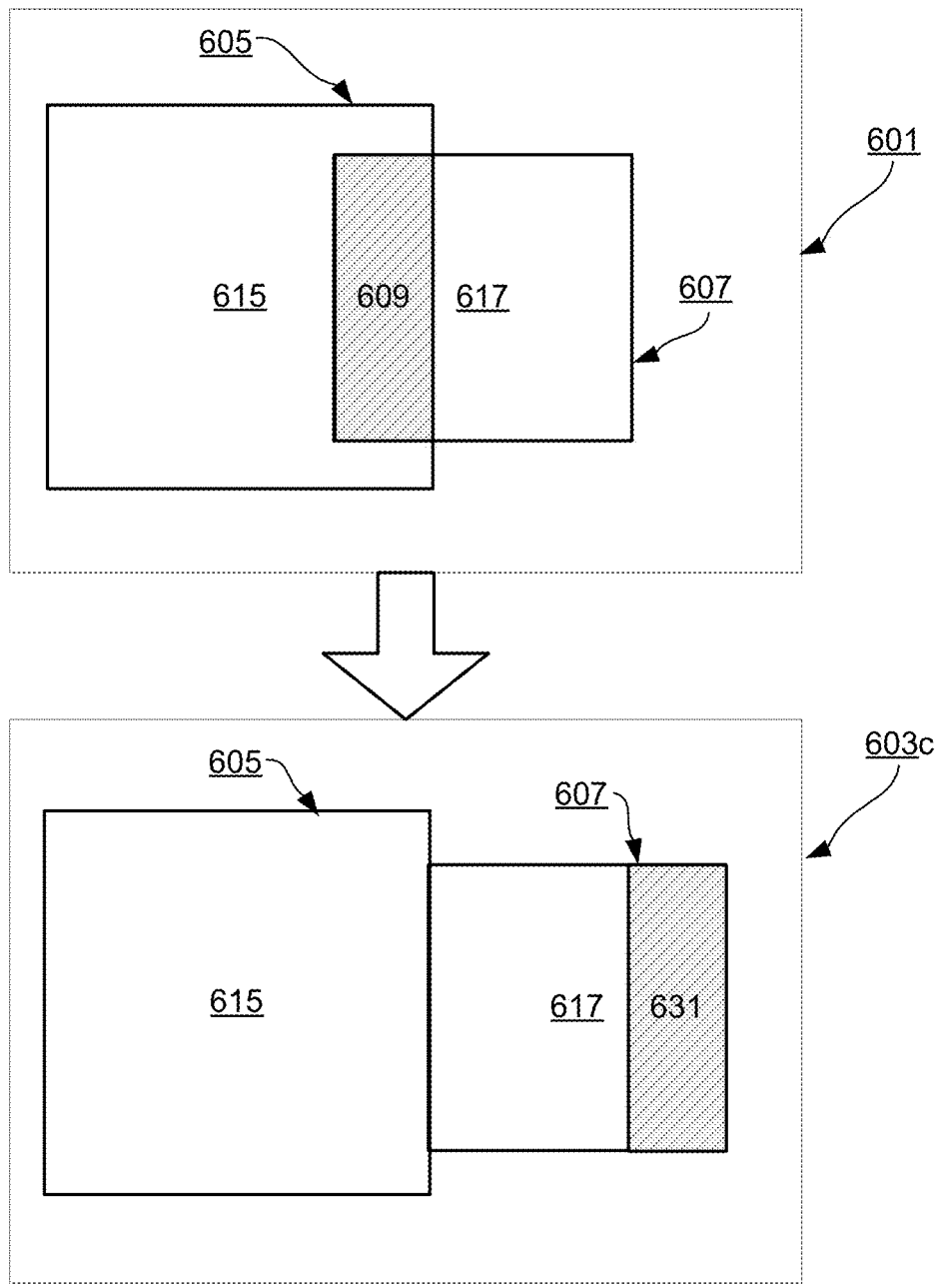
FIG. 6C a PCB design.

In various implementations, a first component group may "shove" a second component group to change position in order to resolve the conflict. For example, FIG. 6C shows the layout 601 of FIG. 6A, including the component groups 605 and 607, the footprints 615 and 617 and the conflicted area 609. An adjusted layout 603c is also shown, which as can be seen shows the positioning of the second component group 607 changed between the layout 601 and the adjusted layout 603c. More specifically, the positioning of the footprint 617 corresponding to the second component group 607 has moved out of the area 609 and into the area 631, as such, resolving the conflict. Various implementations may provide heuristics that cause a first component group to "shove" a second component group based on their relative size, for example, the larger component group may shove the smaller component group as detailed above in relation to FIG. 6C.

Figure 6D:
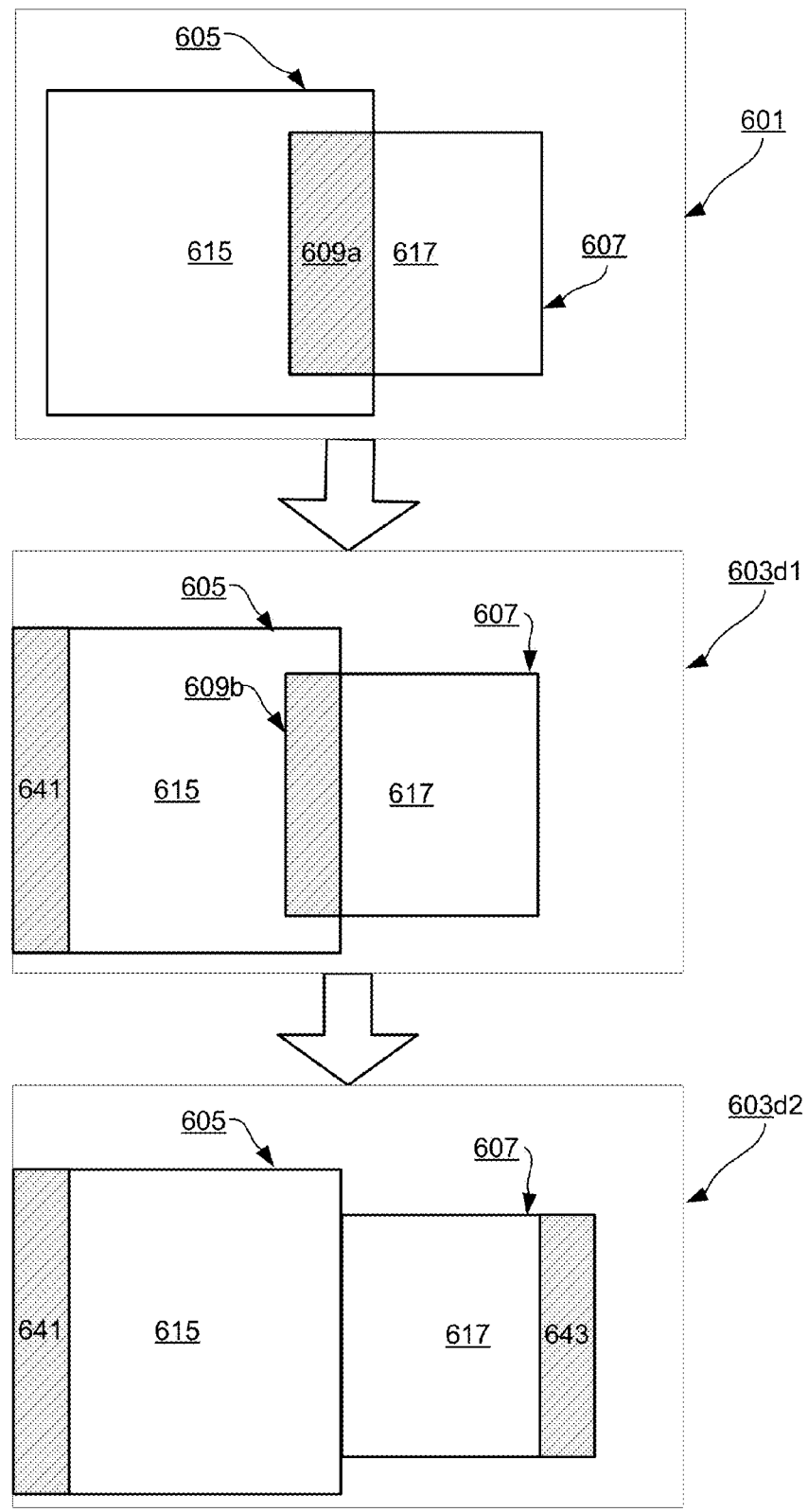
FIG. 6D a PCB design.

As indicated above, some objects within a layout may be fixed, such as, for example, a power bus, or the edge of the layout. As such, these objects cannot be adjusted to resolve a conflict and other adjustments must be made. In some implementations, a heuristic that provides that a component will be shoved (i.e. adjusting the placement location) prior to the component being squeezed (i.e. adjusting the footprint) may be provided to deal with such situations. FIG. 6D shows the layout 601 of FIG. 6A, including the component groups 605 and 607, the footprints 615 and 617 and the conflicted area 609. A first adjusted layout 603d1 is shown, where the first component group 605 has been shoved into the area 641 (i.e. away from the second component group 607) in an effort to attempt to resolve the conflict. However, as can be seen, the conflicted area 609a shown in the unadjusted layout 601, although being reduced, still exits as indicated by the conflicted area 609b. Accordingly, the second component group 607 then is shoved into the area 643 (i.e. away from the first component group 605) until the conflict 609 is resolved. With various implementations, other orderings or adjustment or combinations of adjustment types can be provided. For example, a heuristic specifying the placement location for the originally placed component group will be adjusted first. If the conflict is still not resolved, then the footprint for the originally placed component group will be adjusted.

Figure 6E:
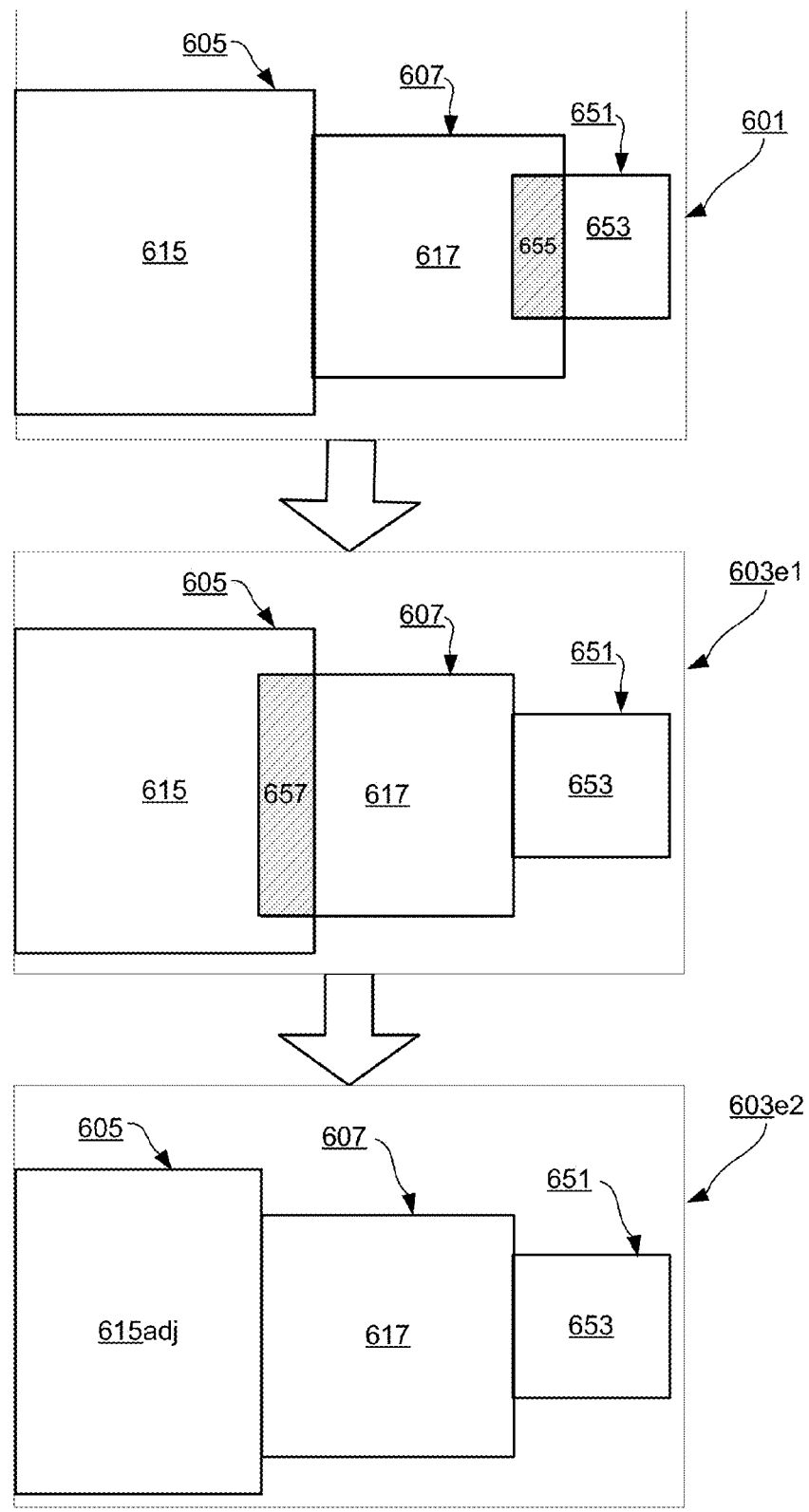
FIG. 6E a PCB design.

With some implementations, a heuristic specifying that multiple component groups be adjusted may be specified. FIG. 6E shows the layout 601 of FIG. 6A, including the component groups 605 and 607, the footprints 615 and 617. Additionally, a third component group 651, having a footprint 653 is shown. As can be seen, the component groups 607 and 651 conflict with each other, as indicated by the conflicted area 655. A first adjusted layout 603e1 is shown, where the placement location for the second component group 607 has been adjusted, More specifically, the second component group 607 has been moved away from the third component group 651 (i.e. out of the conflicted area 655). However, a new conflict, between the first component group 605 and the second component group 607, has been created by this adjustment, as represented by the conflicted area 657. A second adjusted layout 603e2 is shown, where the footprint 615 has been adjusted as represented by the adjusted footprint 615adj. As can be seen, all conflicts have now been resolved within the layout 603e2. As indicated above, and as those of ordinary kill in the art will appreciate, other possible heuristics and adjustment combinations can be formed and provided from the adjustments and heuristics detailed herein.

Conclusion

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A method comprising:
    identifying, from a printed circuit board design, a plurality of components for placing within a layout of the printed circuit board design;
    grouping the plurality of components into at least a first component group and a second component group, wherein the first component group includes a first subset of the plurality of components and the second component group includes a second subset of the plurality of components;
    identifying a first footprint for the first component group within the layout, wherein a location of each component in the first subset is unassigned within the first footprint;
    identifying a second footprint for the second component group within the layout, wherein a location of each component in the second subset is unassigned within the second footprint;
    determining, by one or more computing devices, that the first footprints conflicts with the second footprint within the layout; and
    adjusting, by the one or more computer devices, the first footprint or the second footprint to resolve the conflict.

2. The method recited in claim 1, wherein the adjusting includes moving the first footprint to a different location in the layout such that the first footprint no longer conflicts with the second footprint within the layout.

3. The method recited in claim 1, wherein the adjusting moving the second footprint to a different location in the layout such that the second footprint no longer conflicts with the first footprint within the layout.

4. The method recited in claim 1, wherein the adjusting includes adjusting an aspect ratio of the first footprint such that the first footprint no longer conflicts with the second footprint within the layout.

5. The method of claim 1, wherein the adjusting includes adjusting an aspect ratio of the second footprint such that the first footprint no longer conflicts with the second footprint within the layout.

6. The method of claim 1, wherein the first footprint and the second footprint have different geometric areas.

7. The method of claim 1, wherein the adjusting includes adjusting a length or width of the first footprint such that the first footprint no longer conflicts with the second footprint within the layout.

8. The method of claim 1, wherein the adjusting includes adjusting a shape of the first footprint such that a geographic area of the first footprint is unchanged and the first footprint no longer conflicts with the second footprint within the layout.

9. The method of claim 1, wherein an outer boundary of the first footprint defines a triangle or trapezoid.

10. The method of claim 1, further comprising:
    identifying a target number of components to place in the layout;
    identifying one or more additional footprints for the first component group within the layout, wherein the first footprint, the second footprint and the one or more additional footprints together include the target number of components; and
    determining that the one or more additional footprints conflict with the first footprint or the second footprint.

11. The method of claim 1, wherein the determining is performed while the location of each component in the first subset is unassigned within the first footprint and while the location of each component in the second subset is unassigned within the second footprint.

12. The method of claim 11, wherein the adjusting is performed while the location of each component in the first subset is unassigned within the first footprint and while the location of each component in the second subset is unassigned within the second footprint.

13. One or more computer-readable storage devices storing executable instructions that, when executed, cause an apparatus to:

identify, from a printed circuit board design, a plurality of components for placing within a layout of the printed circuit board design;

group the plurality of components into at least a first component group and a second component group, wherein the first component group includes a first subset of the plurality of components and the second component group includes a second subset of the plurality of components;

identify a first footprint for the first component group within the layout, wherein in a location of each component in the first subset is unassigned within the first footprint;

identify a second footprint for the second component group within the layout, wherein a location of each component in the second subset is unassigned within the second footprint;

determine that the first footprint conflicts with the second footprint within the layout; and adjust the first footprint or the second footprint to resolve the conflict.

14. The one or more computer-readable storage devices recited in claim 13, wherein causing the apparatus to adjust includes causing the apparatus to move the first footprint to a different location in the layout such that the first footprint no longer conflicts with the second footprint within the layout.

15. The one or more computer-readable storage devices recited in claim 13, wherein causing the apparatus to adjust includes causing the apparatus to move the second footprint to a different location in the layout such that the first footprint no longer conflicts with the second footprint within the layout.

16. The one or more computer-readable storage devices recited in claim 13, wherein causing the apparatus to adjust includes causing the apparatus to adjust an aspect ratio of the first footprint such that the first footprint no longer conflicts with the second footprint within the layout.

17. An apparatus, comprising:
one or more processors;
memory storing executable instructions that, when executed by the one or more processors, cause the apparatus to:
identify, from a printed circuit board design, a plurality of components for placing within a layout of the printed circuit board design;

group the plurality of components into at least a first component group and a second component group, wherein the first component group includes a first subset of the plurality of components and the second component group includes a second subset of the plurality of components;

identify a first footprint for the first component group within the layout, wherein a location of each component in the first subset is unassigned within the first footprint;

identify a second footprint for the second component group within the layout, wherein a location of each component in the second subset is unassigned within the second footprint;

determine that the first footprint conflicts with the second footprint within the layout; and adjust the first footprint or the second footprint to resolve the conflict.

18. The apparatus recited in claim 17, wherein causing the apparatus to adjust includes causing the apparatus to move the first footprint to a different location in the layout such that the first footprint no longer conflicts with the second footprint within the layout.

19. The apparatus recited in claim 17, wherein causing the apparatus to adjust includes causing the apparatus to move the second footprint to a different location in the layout such that the first footprint no longer conflicts with the second footprint within the layout.

20. The apparatus recited in claim 17, wherein causing the apparatus to adjust includes causing the apparatus to adjust an aspect ratio of the first footprint such that first footprint no longer conflicts with the second footprint within the layout.

* * * * *